United States Patent [19]

Rust

[11] Patent Number: 5,438,414
[45] Date of Patent: Aug. 1, 1995

[54] INTEGRATED DUAL IMAGING DETECTOR

[75] Inventor: David M. Rust, Silver Spring, Md.

[73] Assignee: The Johns Hopkins University, Baltimore, Md.

[21] Appl. No.: 8,449

[22] Filed: Jan. 22, 1993

[51] Int. Cl.$^6$ ................................................ G01J 4/00
[52] U.S. Cl. .................... 356/364; 250/225; 257/98
[58] Field of Search ............... 356/364–369, 356/152, 141, 319, 322, 402, 416, 419, 327; 250/225, 226; 257/98, 431, 432, 435, 440, 222

[56] References Cited

U.S. PATENT DOCUMENTS 4,709,144 11/1987 Vincent ............................ 250/226
5,102,222 4/1992 Berger et al. .................... 356/367
5,125,743 6/1992 Rust et al. ........................ 356/364

OTHER PUBLICATIONS

D. M. Rust, A Search for Polarization in Ellerman Bombs, Solar Phys. 140, 55–65 (Feb. 1992).

Primary Examiner—Hoa Q. Pham
Attorney, Agent, or Firm—Francis A. Cooch

[57] ABSTRACT

The invention is directed to an integrated dual imaging detector on a single silicon chip comprising a beam interleaving polarization analyzer bonded to a charge-coupled device, serial shift register and associated image transfer circuitry, analog signal processors, and analog-to-digital converters. The invention permits the simultaneous acquisition and processing of two polarization images of rapidly changing subjects.

17 Claims, 4 Drawing Sheets

INTEGRATED DUAL IMAGING DETECTOR

STATEMENT OF GOVERNMENTAL INTEREST

The Government has rights in this invention pursuant to Contract No. N00039-89-C-0001 awarded by the Department of the Navy.

BACKGROUND OF THE INVENTION

The invention relates to image detectors and more specifically, to a polarization analyzer bonded to a charge-coupled device (CCD), serial shift register and associated image transfer circuitry, analog signal processors, and analog-to-digital (A/D) converters, all integrated on a single silicon chip.

All solar activity arises from the action of the sun's magnetic fields. Precise measurements of these fields are essential for a complete description of the storage, release, and transport of energy in solar flares and in all the other energetic phenomena termed "solar activity". To understand solar activity, we must understand the electrodynamic and hydrodynamic processes that build up and store magnetic energy and release it. Explosive release, as in flares, probably occurs by the development of an instability in a sheared magnetic field. The best way to learn which processes are important to solar activity is to map the magnetic fields precisely for long intervals.

While a clearer understanding of the magnetic origins of solar flares would be an exciting development in solar physics, it will also bring important practical benefits. For example, manned exploration of space beyond the earth's magnetosphere will require substantial improvements in the reliability of solar activity forecasts. Without good forecasts, the freedom of astronauts to explore the moon and to carry out extravehicular activity (EVA) will be limited. Lethal or disabling protons from a flare can reach the moon in only 20 minutes after the first optical or X-ray emissions. Thus, whenever there is an active region on the solar disk, the astronauts must be able to reach shelter quickly. One-to-three-hour forecasts could greatly expand the scope of astronaut EVA. Such forecasts would probably have to be based on solar magnetic field maps and the detection of magnetic energy build-up.

Currently, solar vector magnetographs (e.g., Rust, et al. U.S. Pat. No. 5,125,743) are one type of instrument used to produce maps of the sun's magnetic fields. Such maps, called magnetograms, are assembled from precise measurements of the polarization of sunlight, in spectral lines sensitive to the Zeeman effect. Unfortunately, solar vector magnetographs are notoriously complex instruments incorporating rotating or scanning mechanisms often having multiple beams with separate detectors whose outputs must be corrected and correlated before image analysis can begin. An added complication is solar image distortion caused by turbulence in Earth's atmosphere. Even when single image pairs of an event are taken only a fraction of a second apart, that time difference can seriously affect polarization measurements.

In another area of scientific interest and study, the Earth Observing System (EOS) is an important component of the national research thrust to learn more about our environment. The EOS and other earth-observing missions will need to map atomic and molecular emissions with unprecedented spectral and spatial resolution. To understand the chemistry and transport of molecular species in the middle atmosphere, the concentrations of $O_3$, $N_2O$, $CH_4$, $CFCl_3$, $CF_2Cl_2$, $HCl$, $HNO_3$, $H_2O_2$, $HNO_4$, $ClONO_2$, etc., must be mapped with at least 10% accuracy. Such mapping will require precision spectroscopy of the molecular lines.

Other requirements for an imaging spectral radiometer are emerging in the study of the energetics of the upper mesosphere and lower thermosphere, where non-LTE (Local Thermodynamic Equilibrium) excitation is important. Emission line profiles for OH, NO and $CO_2$ need to be studied with high time and spatial resolution to determine the composition and temperature structure of the region. Narrow-band spectral images are required to measure the spatial variation of the outgoing energy.

In another application, polarimetric measurement of light reflected from clouds and ground features provides important information. For example, a. The thermodynamic phase of water droplets and ice crystals in cirrus clouds might be determined from photopolarimetry.
b. Polarimetric imagery provides a potentially rich source of data on flowering and water :stress in corn and soybean crop canopies.

In remote sensing, the precision witch which polarization can be determined is frequently limited by instrument or subject motion, or distortion by atmospheric turbulence on the time scale of the measurement. To fully characterize the state of polarization of incoherent light, at least five measurements must be made and these are usually obtained sequentially. Even at TV rates (30 images/sec), small scene changes between successive frames can seriously degrade polarization measurements, which are derived by subtracting successive images. For real-time applications, an added problem is the high cost and complexity of data processing equipment that can keep up with a stream of TV images.

In one very fast polarization and spectral image analyzer (See Lites, B. W., et al, 1991, Preliminary Results from the HAO/NSO Advanced Stokes Polarimeter Prototype Observing Run, in Solar Polarimetry (L. November, ed.), Sunspot, NM, National Solar Observatory, pp. 3–15.), the image plane of a telescope is scanned with a narrow slit, and the transmitted light is analyzed with several CCDs in a spectrograph. Each CCD operates at 60 frames/sec, and each pixel is digitized to 12-bit precision. To acquire data on orthogonal polarization states simultaneously, this instrument uses a polarizing beamsplitter to illuminate two CCD detectors for each wavelength of interest. The technique provides very high precision, but the complexity of the device and the use of paired detectors, which are difficult to align and intercalibrate, renders it unsuitable for use in space or other harsh environments.

Another device has been able to remove the problem of pixel-to-pixel intercalibration in polarization measurements by using the same pixels for both polarized images. (See Povel, H. P., et al, 1991: Two-Dimensional Polarimeter with CCD Image Sensors and Piezo-Elastic Modulators, in Solar Polarimetry (L. November, ed.), Sunspot, NM, National Solar Observatory, pp. 102–112.) The device masks every other row of a custom-designed CCD so that two images, in alternating phases of polarization, can be stored in the CCD by cycling the two sets of accumulating charge packets in and out of the masked rows in synchronism with the polarization modulator, which operates at 50 kHz. The fast modulation removes the effects of almost any conceivable image motion or distortion. A drawback of the scheme is that it makes very inefficient use of the light.

In short, current spectroscopic imaging polarimeters are too complex. Furthermore, their speed and field of view are frequently too limited to record subtle developments, especially where the spectral lines to be detected differ only very slightly from the background illumination.

What is needed then is an imager which is greatly simplified in design and operation and which is capable of obtaining and precisely registering simultaneous images of a rapidly changing, low contrast scene.

SUMMARY OF THE INVENTION

The problems described above are solved, to a great extent, through the practice of the invention called the integrated dual imaging detector (IDID). The IDID will measure light intensities in two orthogonal polarization states simultaneously with the same optics and with very high precision by integrating two interleaved images on the same image detector. The IDID incorporates a high-density signal processing CCD imager that can produce digitized polarization maps at TV rates. Finally, the IDID is as compact as an ordinary CCD image detector and rugged enough for use in harsh environments, such as space.

Illustratively, a chip, constructed, for example, on a silicon substrate, is comprised of a CCD having interleaved 512×1024-pixel A and B image arrays which cover a majority of the chip area. Bonded to the top of the CCD is a polarization analyzer comprised of a wafer of beamsplitting material, such as rutile, with an optical mask of opaque strips bonded thereto (or the mask can be replaced by a lenslet array). Also, on the chip are serial shift registers and associated image transfer circuitry, analog signal processors, A/D converters and input/output pads and drivers.

When a beam of light is incident on the non-opaque regions on the beamsplitter, the beam is split by the rutile into two parts with orthogonal polarizations. The two parts of the light beam are captured simultaneously by the two interleaved CCD image arrays without interference between them, due to the blocking action of the opaque strips. The two images can then be processed by the on-chip circuitry.

The IDID integrates many optical and electronic functions into a single solid-state device with no moving parts. The IDID has the following additional design features:

Dual interleaved 512×1024-pixel CCDs provide simultaneous data collection in two polarization planes at 10 Mpixels/sec from each output port.

A deep-well buried-channel CCD design with custom doping profiles provides $10^6$ electron storage capacity per pixel. This will allow a precision of 1 part in $10^3$ per frame and 1 part in $10^4$ in 100 frames, when the data are accumulated and averaged externally to the IDID. The imaging rate can be as high as 72 frames/sec.

A customized charge-collection cell design will allow the light-collecting area to be ~85% of the geometrical area.

Bonding the rutile ($TiO_2$) polarizing beamsplitter to the CCD eliminates rotating polarizers and retarders, and separate light paths for orthogonally polarized beams. The rutile beamsplitter allows use of a common light path before the beams are split for analysis, and it thereby eliminates the misalignment and image scale differences encountered when multiple detectors are used. The bonding of the beamsplitter and imager achieves a rugged device which, after initial calibration in the laboratory, will provide polarization measurements that are limited in precision only by photon statistics.

Smearing and loss of precision is avoided by not clocking the CCD during image capture.

Adjacent columns of pixels sense the two planes of polarization at each point in the image to minimize detector gain differences between the two collected images.

On-chip signal processing simplifies post-processing hardware and software.

On-chip A/D converters provide 5 parallel 10-bit digital outputs at high speed, i.e., 10 Mpixels/sec. Low impedance analog outputs of all quantities are also provided.

Thus, the invention provides for the simultaneous collection of dual polarization images by a single chip that is simple in design and operation. The use of high index of refraction material such as rutile for the beamsplitting element also effectively broadens the field of view. Other birefringent materials of lower index may be substituted when field of view is not critical.

When the invention is used with a lithium-niobate Fabry-Perot etalon or other color filter that can encode information from two spectral bands as polarization, the IDID can collect and analyze simultaneous images at two wavelengths for precise photometric analysis of molecular or atomic concentrations in the atmosphere. When used in a solar telescope, the IDID will chart the polarization, which can then be converted to maps of the vector magnetic fields on the solar surface.

For a more complete appreciation of the invention, reference is made to the following detailed description of a preferred embodiment of the invention as depicted in the figures contained within the drawings. The scope of the invention, however, is limited only through the claims appended hereto.

DETAILED DESCRIPTION OF THE PREFERRED EMBODIMENT

Figure 1:
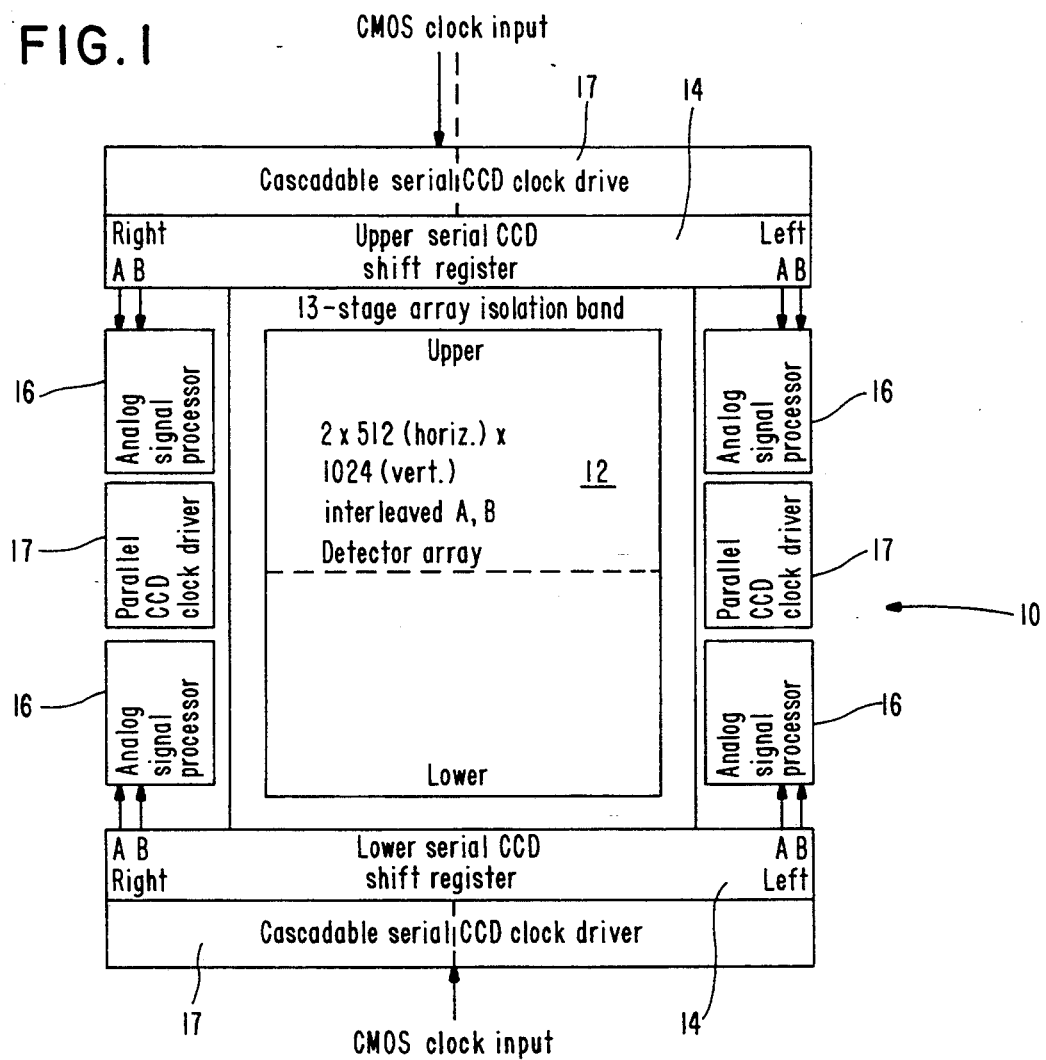
FIG. 1 is a functional block diagram of the invention on a silicon chip.
Figure 2:
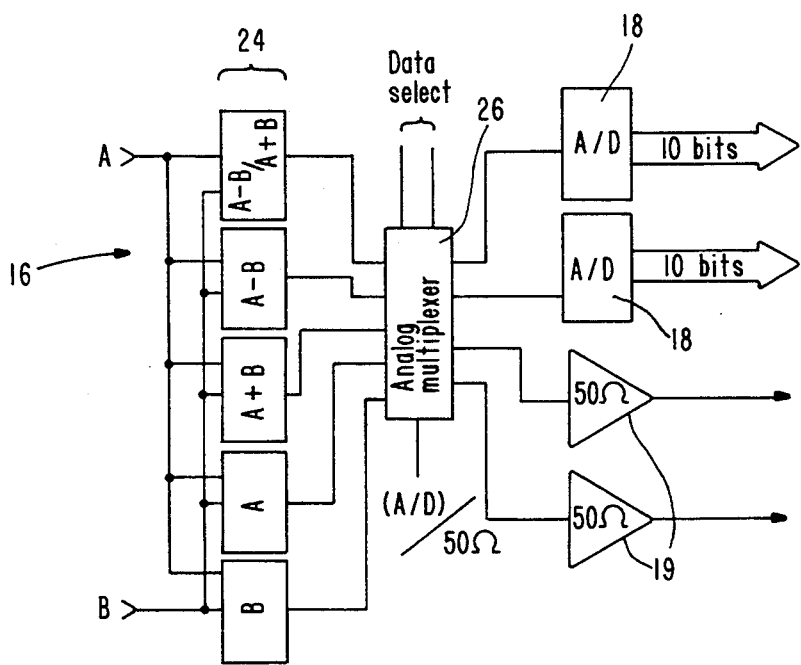
FIG. 2 illustrates an embodiment of the analog signal processor of the invention.

FIG. 1 is a functional block diagram of the IDID chip 10 embodiment of the invention. Broadly, the IDID chip 10 is comprised of interleaved 512×1024-pixel A and B image arrays 12 which cover the majority of the chip area; a beam interleaving polarization analyzer is bonded to the top of the CCD. The remainder of the IDID chip 10 is devoted to the serial shift register and associated image transfer circuitry 14, analog signal processors 16, and input/output pads and drivers 17. FIG. 2 illustrates the details of the analog signal processor 16 including the A/D converters 18 and low impedance analog output drivers 19.

Figure 3:
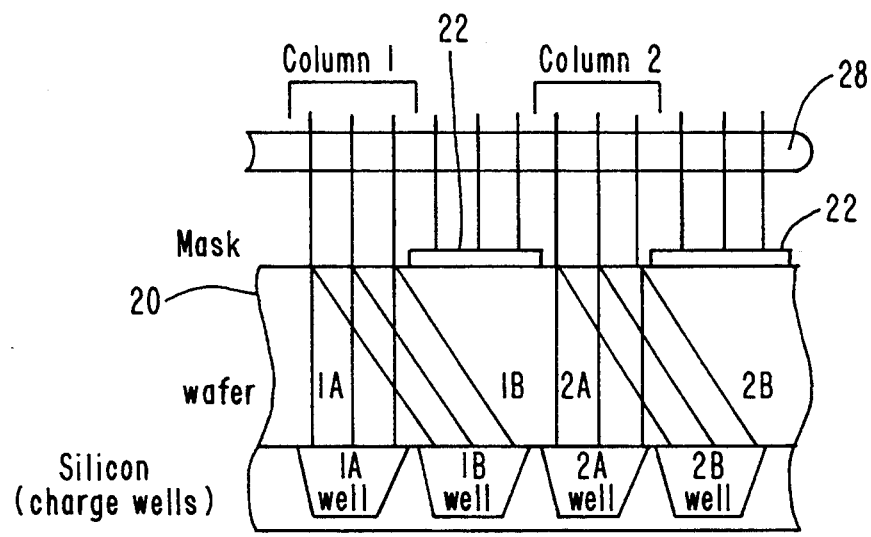
FIG. 3 illustrates a cross section of a portion of one row of the invention's CCD charge collection cells.

The key to the invention is a beam interleaving polarization analyzer (see FIG. 3). The analyzer consists of a wafer of beamsplitting material 20, in this embodiment rutile (TiO$_2$), with an optical mask 22, e.g., Ronchi ruling, bonded thereto. Calcite or other birefringent material could also be used as the wafer. The rutile with the optical mask is, in turn, bonded to the top of the A and B image arrays 12 (see FIG. 1).

Consider a rutile wafer whose optical axis is 45° to the wafer face. Rutile transmits light polarized along the plane containing the optic axis at a different speed than light polarized orthogonally to that plane. Light polarized in the axis plane and normally incident to the wafer face passes straight through the wafer, while orthogonally polarized light refracts and travels through the wafer at an angle from the normal that depends upon the orientation of the optic axis. To obtain the highest separation of the two beams with a rutile or calcite wafer, the crystalline c-axis (optic axis) should make a 45° angle to the face. Then, the maximum angle between the beams is ~6° in visible light.

Linearly polarized light incident on the wafer divides into two beams according to the formulae:

$$I_O = I_i \cos^2 \phi$$

$$I_E = I_i \sin^2 \phi,$$

where $I_i$ is the intensity of the incident beam, $I_O$ is the intensity of the beam that follows the ordinary rules of refraction, $I_E$ is the intensity of the extraordinarily refracted beam, and $\phi$ is the angle that the plane of polarization makes with the plane containing the optic axis. This beamsplitting property of birefringent crystals such as rutile and calcite separates the image focused on the IDID chip 10 into two parts with orthogonal polarizations.

FIG. 3 illustrates a cross section of a small portion of one row of the imager's CCD charge collection cells. A rutile wafer 20, in this embodiment 187 microns thick, divides incident light into the A and B polarization images, deflecting the B polarized light onto the B charge collection cells. An optical mask of opaque strips 22 on the rutile wafer covers the B CCD pixel columns and eliminates mixing of the A and B images. The opaque strips 22 are perpendicular to the plane containing the optic axis, and the pitch of the ruling is matched to the thickness of the wafer so that the ordinary and extraordinary rays illuminate the A- and B- charge collection cells alternately. Thus, light with polarization state A passes straight through the rutile and falls on the collection cell directly below, while light with the orthogonal polarization state B is deviated enough to fall exactly on the collection cell in the next column, under an opaque strip of the optical mask. Note that, despite the opaque masks, pixels A and B of each pair sample the same image element.

Figure 4:
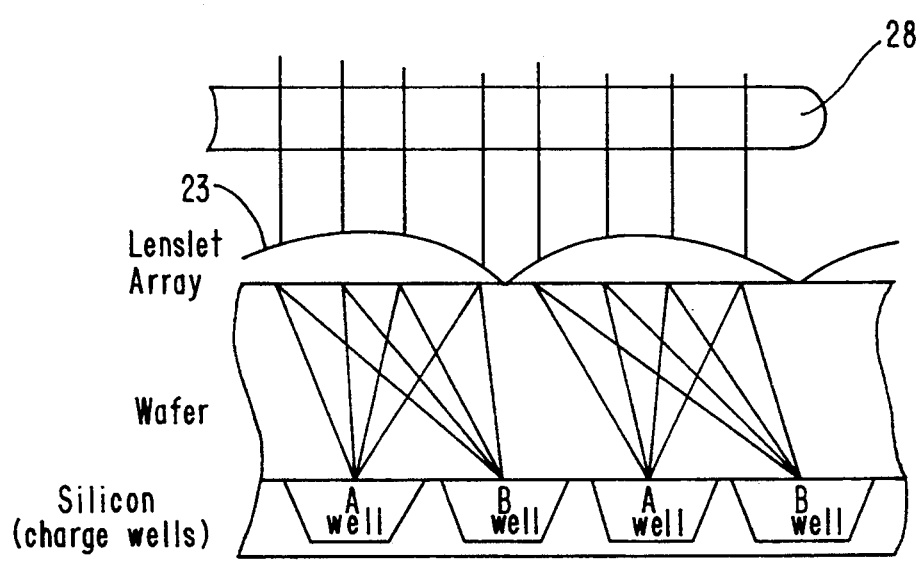
FIG. 4 illustrates an embodiment of the invention which uses a lenslet array in place of an opaque mask.

In another embodiment of the invention, the mask can be replaced with an array of parallel cylindrical lenslets as illustrated in FIG. 4. With the lenslet array 23, all of the light is used rather than half being lost with the opaque mask.

In one embodiment, the IDID uses a buried-channel 2-poly layer, 2-metal layer CCD process. The CCD was custom-designed to operate at high gate capacitance $C_g$ and at relatively high potential difference V between the barrier and storage gates. Since the number of electrons N that can be stored in each pixel is $VA_gC_g/e$, where $A_g$ is the area of the storage gate and e is the charge associated with the electron, the IDID design uses a 3-volt deep well buried-channel 2-poly 2-metal process, which allows a high storage capacity: $N = 10^6$ electrons/pixel. This large charge storage capacity provides $10^{-4}$ polarization sensitivity, which is needed in many applications, after collection of only 100 images and, therefore, in less time than for shallow-well detectors. An additional advantage is that the polarization signal depends only on the incident light and on the ratios of the gains in each A/B pixel pair. These ratios can be established with very high precision by routine laboratory measurements.

Figure 5:
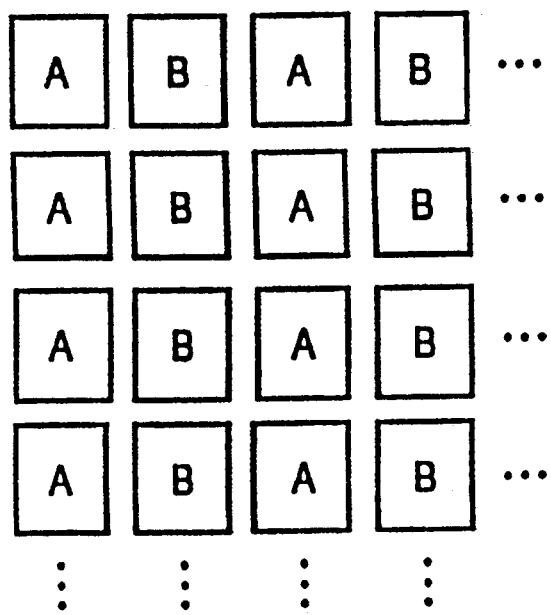
FIG. 5 illustrates the layout of the invention's CCD charge collection cells.

FIG. 5 shows the layout of the IDID CCD charge collection cells. In one embodiment, each cell, or pixel, is 20 μm square, with a 17 μm×20 μm light collection area, and a 3-μm isolation barrier to keep charge from flowing between columns of pixels. Alternate columns of pixels store charge from light with orthogonal polarization directions A and B. The geometry of each charge collection cell minimizes the area, used to isolate adjacent cells, thus maximizing the area available for light collection. The IDID design yields a charge collection area equal to ~85% of the total array area.

The IDID design requires proper spacing and alignment of mask lines (to within ~1 micron), choice of wafer thickness, CCD pixel size, and orientation of the rutile optical axis with respect to the CCD array. In the embodiment with the 187 μm rutile wafer, it also requires the f-number of the beam focused on the detector to be at least f/12, to keep each beam from illuminating more than one pixel. Because of the high indices of refraction of rutile ($n_O = 2.6$ and $n_E = 2.9$) the effective f-number inside the wafer is ~32. The opaque strips of the ruling are wider than the transparent strips, 23 μm vs. 17 μm, so that light of polarizations A and B do not overlap on the pixel edges.

With regard to the remainder of the IDID chip 10, as shown in FIG. 1, a serial shift register and associated image transfer, i.e., clock, circuitry 14 reads out the entire A and B image array in 13.8 milliseconds. In the read-out mode, vertical clock signals shift full rows of the CCD into the shift register at 13.1 μsec per row, and horizontal clock signals shift these charges to the output port at 100 nanoseconds per pixel pair. Each pair consists of an A and a B image pixel, and the output port presents both pixels in a pair simultaneously.

The horizontal and vertical clocks and other shift control signals are generated off-chip to minimize clock-induced noise and to allow flexibility. The clock drivers 17 are on the chip.

As shown in FIG. 2, the A and B image pixels pass through analog signal processing circuitry 24 which computes A−B, A+B and (A−B)/(A+B) on a pixel-by-pixel basis. This gives the user immediate access to the A, B, A−B, A+B and (A−B)/(A+B) arithmetic results, each at 10 million pixel pairs per second. Traditional analog techniques are used to form the quotient while processing of the sum and difference signals is done in the charge domain. The charge domain signal processing techniques used yield a data precision of 6 parts in $10^5$ or better due to the following features:

a. the CCD is buried channel, giving rise to ultra low trapping densities and transfer noise on the order of 10 electrons RMS when cooled to −50° C. or below, b. thinned epitaxial substrates yield superior dark current performance (10 pA/cm$^2$) when the chip is cooled to −50° C. or below, and c. the arithmetic and A/D architectures are comprised of ultra-small CCD structures which minimize the number of transfers.

Two digital and two 50-ohm analog output channels are available per port. The five outputs of the arithmetic unit are digitized to 10 bits using A/D converters 18. The A/D conversion is based on a compact, high-speed (20 Mpixel/sec) pipe-lined charge-domain circuit with 10-bit accuracy. An analog multiplexer 26 drives the individual output circuits with the respective results from the signal processing functions. There are four sets of output ports to avoid crippling the device in case of a failure in an output port.

The choice of whether to use the analog or digital output channels in a particular application will depend on the desired precision. For many measurements, 10-bit precision will be adequate and the digitized signals can be used directly. Quantum efficiency differences between adjacent A and B pixels may actually limit the precision to ~1% in such cases. For higher precision applications, the A−B, A+B and (A−B)/(A+B) analog signals can be digitized externally at 12- to 16-bit resolution and the results corrected for quantum efficiency variations by reference to a look-up table. This 'gain table' can be obtained anytime by illuminating the IDID with spatially uniform unpolarized light. The gain corrections will be quite stable since the polarimetric precision will depend (aside from photon statistical noise) only on the ratios, $g_A/g_B$, of the gains of the pixel pairs. Since the light reaching each pixel in an A,B pair will follow one optical path before entering the IDID, the usual sources that make gain tables unstable, e.g., flexure in the apparatus and dust particles, will affect the signal levels in A and B in the same proportions, and they will cancel out of the ratios.

Figure 6:
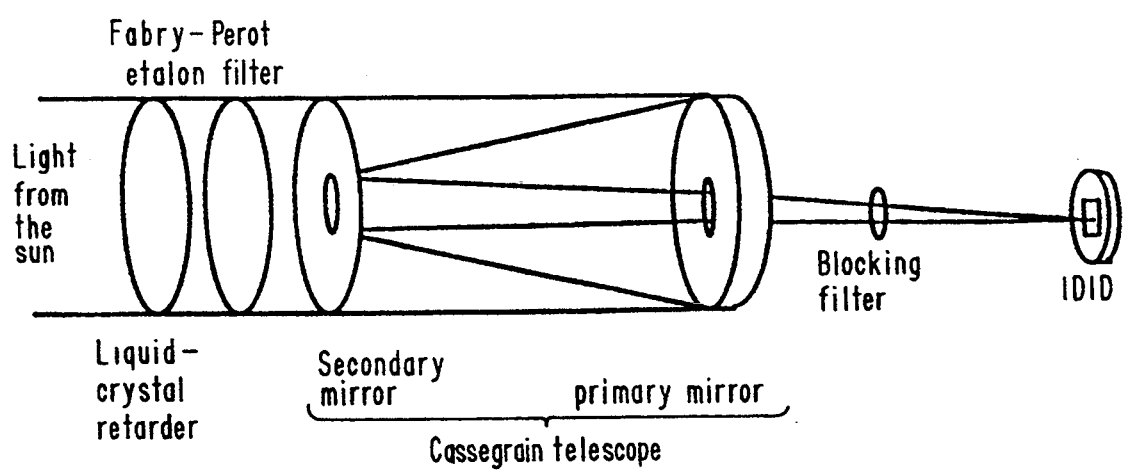
FIG. 6 illustrates the use of the invention in a solar magnetograph.

FIG. 6 shows how the IDID could be used in a compact solar magnetograph. Together, the liquid-crystal retarder and the IDID discriminate between circularly-polarized light (Stokes V) and the linear components (Stokes Q and U parameters). The order-selection (or blocking) filter and the Fabry-Perot etalon spectrally isolate a small part of the profile of a magnetically-sensitive atomic line.

The primary mirror of the Cassegrain telescope focuses the solar image on the IDID, which has two main functions: collection of the tessellated orthogonal polarization images, and front-end signal processing in the collected charge domain, which forms the pixel-by-pixel sum and difference values. The fundamental products of the IDID, besides two polarized images, A, B, (which could, for example, correspond to the scene as recorded with a polarizer in the vertical and horizontal orientations, respectively) are difference images, A−B, combined images, A+B, and intensity-corrected images, (A−B)/(A+B). Depending on the state of the liquid crystal retarder, the intensity-corrected images represent Stokes V, Q or U.

When an auxiliary filter is used to encode wavelengths as polarization, A−B would represent a point in the spectrum corrected for background. In another application, the quotient, (A−B)/(A+B), would represent the Doppler velocity of the solar gases when images A and B come from the two wings of an atomic line.

Other image qualities such as spectral content and focus can be measured with high speed and precision if they are encoded as polarization. For spectral studies, the IDID can be used behind an encoding means 28 (FIGS. 3 and 4) such as a birefringent Fabry-Perot etalon or other filters (e.g., dichroics, Lyot-type) that encode spectral information as orthogonal states of polarization. For example, an etalon made of y-cut lithium niobate, which is an electro-optic birefringent crystal, has two sets of passbands. These passbands are orthogonally polarized, and one set of them can be scanned in wavelength by application of voltage to the crystal. A lithium niobate etalon and the IDID can scan the spectrum with one passband and hold the other fixed to provide a reference image for precision photometry of molecular and atomic lines.

Figure 7:
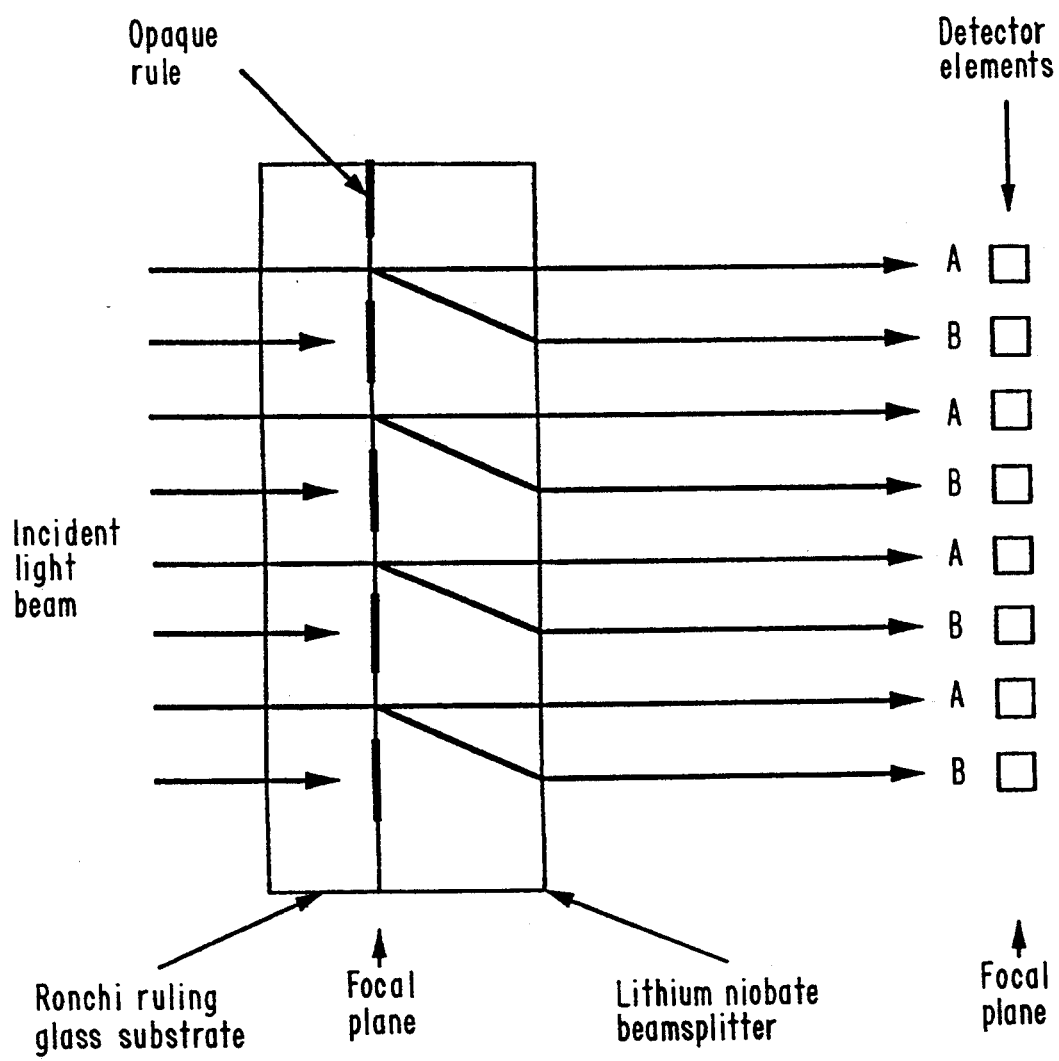
FIG. 7 is a side view of one embodiment of the beam interleaving polarization analyzer of the invention.

FIG. 7 illustrates a non-IDID embodiment of the beam interleaving polarization analyzer of the invention. As shown in FIG. 7, a beamsplitting material, in this case a crystal of birefringent material such as lithium niobate mercurous chloride or mercuors bromide, is cut at 45° to the optic axis so that incident light entering the crystal is split into orthogonally polarized components—A and B. The crystal is cemented to a Ronchi ruling in which opaque strips block half the incident light.

The thickness of the crystal is chosen to shift the B polarized beam by one opaque strip width. With 50.0 μm opaque strips, this thickness is 1.35 mm in a crystalline lithium niobate beamsplitter.

Exiting the crystal, the A and B components of an image formed on the Ronchi ruling are interleaved. The image is then reimaged by lenses onto an image detector, such as a CCD, with rows of picture elements that correspond to the A and B leaves. A and B are recorded in a single exposure simultaneously and can then be separated by processing in a digital computer.

Thus, the IDID provides both a beam interleaving polarization analyzer and image processing circuitry on a single silicon chip. The resulting imager is simple in design and operation and is capable of analyzing the polarization in rapidly changing images. The underlying technology associated with this device, however, may have much wider applicability. Specifically, successful incorporation of signal processing with the collected charges in real time may show the way to reduce the amount of digital signal processing hardware required for many imaging applications. Furthermore, precision relative spectrophotometry and polarimetry should be able to emerge from the benign environment of the laboratory.

We claim:

1. A polarization analyzer for the simultaneous collection of two polarization images on a detector array comprising:

a charge-coupled device (CCD) comprising a detector array of columns of charge collection cells;

a wafer of beamsplitting material bonded to the CCD on top of the array of charge collection cells; and an optical mask bonded to the wafer of beamsplitting material and comprising a plurality of opaque strips covering alternate columns of the charge collection cells; whereby a beam of light incident on the wafer is split by the beamsplitting material into two polarization images, the first image passing straight through the beamsplitting material and falling on the columns of charge collection cells not covered by the optical mask and the second image being refracted through the beamsplitting material to fall on the columns of charge collection cells covered by the optical mask, the optical mask preventing the two images from mixing.

2. The polarization analyzer as recited in claim 1, wherein the beam splitting material comprises rutile ($TiO_2$).

3. The polarization analyzer as recited in claim 1, wherein the CCD comprises two interleaved pixel image arrays.

4. A polarization analyzer for the simultaneous collection of two polarization images from a light beam incident on a detector array comprising:
   a beamsplitting material; and
   an optical mask bonded to the beamsplitting material and comprising a plurality of opaque strips, the opaque strips blocking half of the incident light beam.; whereby the incident light beam on the detector array is split by the beamsplitting material into two polarization images, the first image passing straight through the beamsplitting material and falling on the detector array not blocked by the optical mask and the second image being refracted through the beamsplitting material to fall on the detector array blocked by the optical mask.

5. The polarization analyzer as recited in claim 4, wherein the beamsplitting material comprises a crystal of birefringent material.

6. The polarization analyzer as recited in claim 5, wherein the birefringent material is cut at 45° to an optic axis.

7. The polarization analyzer as recited in claim 6, wherein the birefringent material comprises lithium niobate.

8. The polarization analyzer as recited in claims 5 or 6, wherein the birefringent material comprises mercurous chloride.

9. The polarization analyzer as recited in claims 5 or 6, wherein the birefringent material comprises mercurous bromide.

10. The polarization analyzer as recited in claim 5, wherein the birefringent material comprises lithium niobate.

11. The polarization analyzer as recited in claim 4, wherein the optical mask is a Ronchi ruling.

12. The polarization analyzer as recited in claim 4, wherein the detector array is a charge-coupled device.

13. A photometric device comprising:
   means for encoding spectral information from light as orthogonal states of polarization; and
   a polarization analyzer comprising:
      a charge-couple device (CCD) comprising a detector array of columns of charge collection cells:
      a wafer of beamsplitting material bonded to the CCD on top of the array of charge collection cells; and
      an optical mask bonded to the wafer of beamsplitting material and comprising a plurality of opaque strips covering alternate columns of the charge collection cells; whereby a beam of light incident on the wafer is split by the beamsplitting material into two polarization images, the first image passing straight through the beamsplitting material and falling on the columns of charge collection cells not covered by the optical mask and the second image being refracted through the beamsplitting material to fall on the columns of charge collection cells covered by the optical mask, the optical mask preventing the two images from mixing, the polarization analyzer for separating the polarized light received from the encoding means to permit simultaneous imaging at two wavelengths.

14. The photometric device as recited in claim 13, wherein the encoding means comprises a dichroic polarizer.

15. The photometric device as recited in claim 13, wherein the encoding means comprises a Lyot birefringent filter.

16. The photometric device as recited in claim 13, wherein the encoding means comprises a y-cut lithium niobate etalon.

17. A polarization analyzer for the simultaneous collection of two polarization images on a detector array comprising:
   a charge-coupled device (CCD) comprising a detector array of columns of charge collection cells;
   a wafer of beamsplitting material bonded to the CCD on top of the array of charge collection cells; and
   an array of parallel cylindrical lenslets bonded to the wafer of beamsplitting material; whereby a beam of light incident on the array of lenslets is focused on alternate columns of the charge collection cells and is split by the beamsplitting material into two polarization images, the first image passing straight through the beamsplitting material and falling on the alternate columns of the charge collection cells and the second image being refracted through the beamsplitting material to fall on the columns of the charge collection cells on which the incident light is not focused by the array of lenslets, the array of lenslets preventing the two images from mixing.

* * * * *